(12) United States Patent
Ho

(10) Patent No.: US 11,227,824 B1
(45) Date of Patent: Jan. 18, 2022

(54) CHIP CARRIER AND MANUFACTURING METHOD THEREOF

(71) Applicant: Chung W. Ho, Taipei (TW)

(72) Inventor: Chung W. Ho, Taipei (TW)

( * ) Notice: Subject to any disclaimer, the term of this patent is extended or adjusted under 35 U.S.C. 154(b) by 0 days.

(21) Appl. No.: 17/241,081

(22) Filed: Apr. 27, 2021

(30) Foreign Application Priority Data

Dec. 15, 2020 (TW) .................................. 109144168

(51) Int. Cl.
| | |
|---|---|
| *H01L 23/498* | (2006.01) |
| *H01L 21/683* | (2006.01) |
| *H01L 21/48* | (2006.01) |
| *H01L 23/13* | (2006.01) |
| *H01L 23/00* | (2006.01) |
| *H01L 23/31* | (2006.01) |

(52) U.S. Cl.
CPC .... *H01L 23/49822* (2013.01); *H01L 21/4857* (2013.01); *H01L 21/6835* (2013.01); *H01L 23/13* (2013.01); *H01L 23/3185* (2013.01); *H01L 23/49894* (2013.01); *H01L 24/73* (2013.01); *H01L 2221/68345* (2013.01); *H01L 2221/68381* (2013.01); *H01L 2224/73204* (2013.01)

(58) Field of Classification Search
CPC ........... H01L 23/49822; H01L 21/6835; H01L 21/4857; H01L 23/13; H01L 24/73; H01L 23/3185; H01L 2224/73204; H01L 23/49894; H01L 2221/68345; H01L 2221/68381
USPC ....................................................... 438/125
See application file for complete search history.

(56) References Cited

U.S. PATENT DOCUMENTS

| | | | |
|---|---|---|---|
| 10,004,143 B2 * | 6/2018 | Ishihara | ............... H05K 3/4697 |
| 10,804,205 B1 * | 10/2020 | Lin | ................... H01L 23/49822 |
| 2012/0090883 A1 * | 4/2012 | Bchir | ................ H01L 23/49894 |
| | | | 174/258 |
| 2017/0064835 A1 | 3/2017 | Ishihara et al. | |
| 2020/0163223 A1 * | 5/2020 | Mok | ...................... H05K 1/185 |

* cited by examiner

*Primary Examiner* — Vu A Vu
(74) *Attorney, Agent, or Firm* — JCIPRNET

(57) ABSTRACT

A chip carrier and a manufacturing method thereof are provided. The chip carrier includes a first structure layer and a second structure layer. The first structure layer has at least one opening and includes at least one first insulating layer. A thermal expansion coefficient of the first insulating layer is between 2 ppm/° C. and 5 ppm/° C. The second structure layer is disposed on the first structure layer and defines at least one cavity with the first structure layer. The second structure layer includes at least one second insulating layer, and a thermal expansion coefficient of the second insulating layer is equal to or greater than the thermal expansion coefficient of the first insulating layer.

23 Claims, 12 Drawing Sheets

CHIP CARRIER AND MANUFACTURING METHOD THEREOF

CROSS-REFERENCE TO RELATED APPLICATION

This application claims the priority benefit of Taiwanese application no. 109144168, filed on Dec. 15, 2020. The entirety of the above-mentioned patent application is hereby incorporated by reference herein and made a part of this specification.

BACKGROUND

Technical Field

The disclosure relates to a carrier structure and a manufacturing method thereof; in particular, the disclosure relates to a chip carrier and a manufacturing method thereof.

Description of Related Art

Generally speaking, the manufacturing of FCCSP and FCBGA, the mainstream products in mass production of flip chip substrates, starts from one core substrate, and by drilling, copper plating, and wiring, double-sided circuits are completed. Then, several or multiple build-up layers are manufactured on both sides of the core substrate. For the insulating material of the FCCSP build-up layer, BT is adopted, for example, and for the insulating material of FCBGA build-up layer, because of the relatively thin circuit, ABF is adopted, for example. To maintain the stability of the carrier during manufacturing and to prevent warping of the product board, the number and thickness of build-up layers above the core substrate requires to be equal to the number and thickness of build-up layers and their insulating materials below the core substrate. However, for maintaining the stability of the carrier, the core substrate requires to be of a relatively large thickness, its mechanical drilling density (4×) is lower than the laser blind hole density, and the bandwidth of telecommunications transmission through this substrate is affected. Moreover, the build-up layer above the core substrate is necessary for the product, but the build-up layer below the core substrate is mainly to maintain the above-mentioned mechanical stability, thus increasing the materials, costs, and manufacturing time.

FCBGA has a relatively great number of double-sided build-up layers, and mostly in the build-up material ABF, glass fiber is not contained because of its relatively high thermal expansion coefficient. In addition, the chip and the carrier are of a large area. After the chip is placed, the expansion coefficient of the resin molding added thereon is also relatively high. With the above taken into consideration, the high-end core substrate of FCBGA is excessively thick, reaching 1.2 mm to maintain the mechanical stability, and the material and process costs are also increased.

SUMMARY

The disclosure is directed to a chip carrier, in which a coreless process is adopted in place of the process where a core substrate is present to reduce the materials, improve the performance, and accelerate the process in time.

The disclosure is also directed to a manufacturing method of a chip carrier, adapted to manufacture the above-mentioned chip carrier, involving fewer manufacturing steps and effectively saving manufacturing costs.

According to an embodiment of the disclosure, a chip carrier includes a first structure layer and a second structure layer. The first structure layer has at least one opening and includes at least one first insulating layer. A thermal expansion coefficient of the first insulating layer is between 2 ppm/° C. and 5 ppm/° C. The second structure layer is disposed on the first structure layer and defines at least one cavity with the first structure layer. The second structure layer includes at least one second insulating layer, and a thermal expansion coefficient of the second insulating layer is equal to or greater than the thermal expansion coefficient of the first insulating layer.

In the chip carrier according to an embodiment of the disclosure, a material of the first insulating layer includes glass fiber resin.

In the chip carrier according to an embodiment of the disclosure, a material of the second insulating layer includes bismaleimide-triazine (BT) resin or an Ajinomoto build-up film (ABF).

In the chip carrier according to an embodiment of the disclosure, the second structure layer also includes a plurality of conductive through holes and a plurality of patterned circuit layers. The second insulating layer includes a plurality of second insulating layers. The conductive through holes are embedded in the second insulating layers. The patterned circuit layers are alternately stacked with the second insulating layers, and the patterned circuit layers are electrically connected through the conductive through holes.

In the chip carrier according to an embodiment of the disclosure, the first structure layer also includes a plurality of conductive pillars. The first insulating layer includes a plurality of first insulating layers. The conductive pillars penetrate the first insulating layers that overlap each other. The patterned circuit layers of the second structure layer are electrically connected to the conductive pillars of the first structure layer through the conductive through holes.

In the chip carrier according to an embodiment of the disclosure, the first insulating layer of the first structure layer includes a plurality of first insulating layers, and the first insulating layers are directly stacked together with each other.

In the chip carrier according to an embodiment of the disclosure, the chip carrier also includes a third structure layer, which is disposed on the second structure layer and is electrically connected to the second structure layer. The second structure layer is located between the first structure layer and the third structure layer. The third structure layer includes at least one third insulating layer, and a thermal expansion coefficient of the third insulating layer is the same as the thermal expansion coefficient of each of the first insulating layers.

In the chip carrier according to an embodiment of the disclosure, the chip carrier also includes an adhesive and at least one third structure layer. The adhesive sheet is disposed on the second structure layer, and is in a B stage. The third structure layer is disposed on the adhesive sheet, and is fixed on the second structure layer through the adhesive sheet.

In the chip carrier according to an embodiment of the disclosure, the chip carrier also includes a conductive paste. The adhesive sheet has a plurality of through holes. The conductive paste is filled in the through holes, and electrically connects the third structure layer with the second structure layer.

In the chip carrier according to an embodiment of the disclosure, the chip carrier also includes a solder mask layer, which is disposed on the second structure layer, and exposes part of the second structure layer.

In the chip carrier according to an embodiment of the disclosure, the chip carrier also includes a plurality of solder balls, which is disposed on the second structure layer exposed by the solder mask layer.

In the chip carrier according to an embodiment of the disclosure, a depth of the cavity is between 150 μm and 300 μm.

According to an embodiment of the disclosure, a manufacturing method of a chip carrier includes the following steps. A reusable carrier is provided. The carrier includes a core layer, a plurality of bumps disposed on opposite sides of the core layer, a stainless steel layer sputtered on the core layer and the bumps, and a copper layer formed on the stainless steel layer. At least one first insulating layer and at least one second insulating layer located on the first insulating layer are pressed on opposite sides of the carrier. The first insulating layer has at least one opening. The opening exposes the bumps. Part of the copper layer located on the bumps directly contacts the second insulating layer. A thermal expansion coefficient of the first insulating layer is between 2 ppm/° C. and 5 ppm/° C., and a thermal expansion coefficient of the second insulating layer is equal to or greater than the thermal expansion coefficient of the first insulating layer. In addition, the carrier and the first insulating layer are separated to form a plurality of chip carriers separated from each other. Each of the chip carriers includes a first structure layer and a second structure layer stacked with each other. The first structure layer includes the first insulating layer, the second structure layer includes the second insulating layer, and the first structure layer and the second structure layer define at least one cavity.

In the manufacturing method according to an embodiment of the disclosure, the manufacturing method also includes the following. While the first insulating layer and the second insulating layer located on the first insulating layer are pressed on the opposite sides of the carrier, a copper sheet is pressed on the second insulating layer. A drilling process, an electroplating process, a patterning process, and a layer build-up process are performed on the copper sheet and the second insulating layer to form a plurality of conductive through holes and a plurality of patterned circuit layers. The second insulating layer includes a plurality of second insulating layers. The conductive through holes are embedded in the second insulating layers. The patterned circuit layers are alternately stacked with the second insulating layers, and the patterned circuit layers are electrically connected through the conductive through holes.

In the manufacturing method according to an embodiment of the disclosure, the manufacturing method also includes the following. Before the first insulating layer and the second insulating layer located on the first insulating layer are pressed on the opposite sides of the carrier, a plurality of conductive pillars are formed on the opposite sides of the carrier, and the conductive pillars are located on the copper layer. After the first insulating layer and the second insulating layer located on the first insulating layer are pressed on the opposite sides of the carrier, the conductive pillars penetrate the first insulating layer and abut the second insulating layer. In addition, after the conductive through holes and the patterned circuit layers are formed, the patterned circuit layers are electrically connect to the conductive pillars through the conductive through holes.

In the manufacturing method according to an embodiment of the disclosure, the manufacturing method also includes the following. Before the carrier and the first insulating layer are separated, a solder mask layer is formed on the outermost second insulating layer, and the solder mask layer exposes part of the outermost patterned circuit layer.

In the manufacturing method according to an embodiment of the disclosure, the manufacturing method also includes the following. After the carrier and the first insulating layer are separated, a plurality of solder balls are formed on the patterned circuit layer exposed by the solder mask layer.

In the manufacturing method according to an embodiment of the disclosure, the step of separating the carrier and the first insulating layer includes the following. The copper layer and the stainless steel layer are separated. In addition, the copper layer is removed and the first insulating layer is exposed.

In the manufacturing method according to an embodiment of the disclosure, a material of the first insulating layer includes glass fiber resin.

In the manufacturing method according to an embodiment of the disclosure, a material of the second insulating layer includes bismaleimide-triazine resin or an Ajinomoto build-up film.

In the manufacturing method according to an embodiment of the disclosure, a depth of the cavity is between 150 μm and 300 μm.

In the manufacturing method according to an embodiment of the disclosure, after the stainless steel layer is sputtered on the bumps and the copper layer is formed on the stainless steel layer, a chip is placed beside the bumps. In addition, in the step of pressing the first insulating layer and the second insulating layer located on the first insulating layer, the first insulating layer is first pressed, such that the opening of the first insulating layer exposes the bumps and the chip, and then the second insulating layer is pressed.

Based on the foregoing, in the design of the chip carrier of the disclosure, the second structure layer and the first structure layer having the opening define the cavity for placing, for example, the chip and/or the passive element. The low thermal expansion coefficient of the first insulating layer in the first structure layer is only between 2 ppm/° C. and 5 ppm/° C. In this way, the chip disposed in the cavity and located in the opening have a thermal expansion coefficient similar to that of the first insulating layer, facilitating reliability in subsequent packaging.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
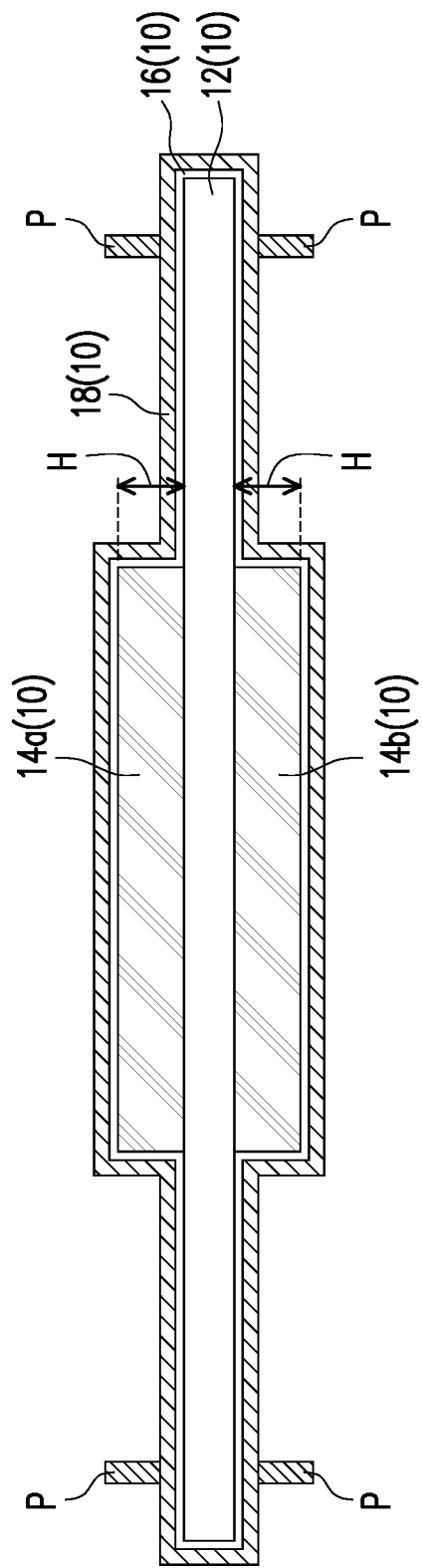
FIG. 1A to FIG. 1G are schematic cross-sectional views of a manufacturing method of a chip carrier according to an embodiment of the disclosure.

Reference will now be made in detail to the exemplary embodiments of the disclosure, examples of which are illustrated in the accompanying drawings. Wherever possible, the same reference numerals are used in the drawings and description to represent the same or similar parts.

FIG. 1A to FIG. 1G are schematic cross-sectional views of a manufacturing method of a chip carrier according to an embodiment of the disclosure. Regarding the manufacturing method of a chip carrier of this embodiment, with reference to FIG. 1A first, a reusable carrier 10 is provided. To be specific, the carrier 10 includes a core layer 12, a plurality of bumps 14a and 14b disposed on opposite sides of the core layer 12, a stainless steel layer 16 sputtered on the core layer 12 and the bumps 14a and 14b, and a copper layer 18 formed on the stainless steel layer 16. Herein, the core layer 12 is, for example but not limited to, a stainless steel substrate or core substrate (i.e., a rigid board, including a glass fiber resin substrate and copper foils located on opposite sides of the glass fiber resin substrate). A height H of the bumps 14a and 14b is, for example, 150 μm to 300 μm. The height H of the bumps 14a and 14b is namely a depth D of a subsequently formed cavity C (with reference to FIG. 1G). In addition, a thermal expansion coefficient of the carrier 10 of the embodiment is, for example, 17 ppm/° C., which reduces stress in the subsequent manufacturing process.

Then, with further reference to FIG. 1A, a plurality of conductive pillars P may be selectively formed on opposite sides of the carrier 10, and the conductive pillars P are located on the copper layer 18.

Figure 1B:
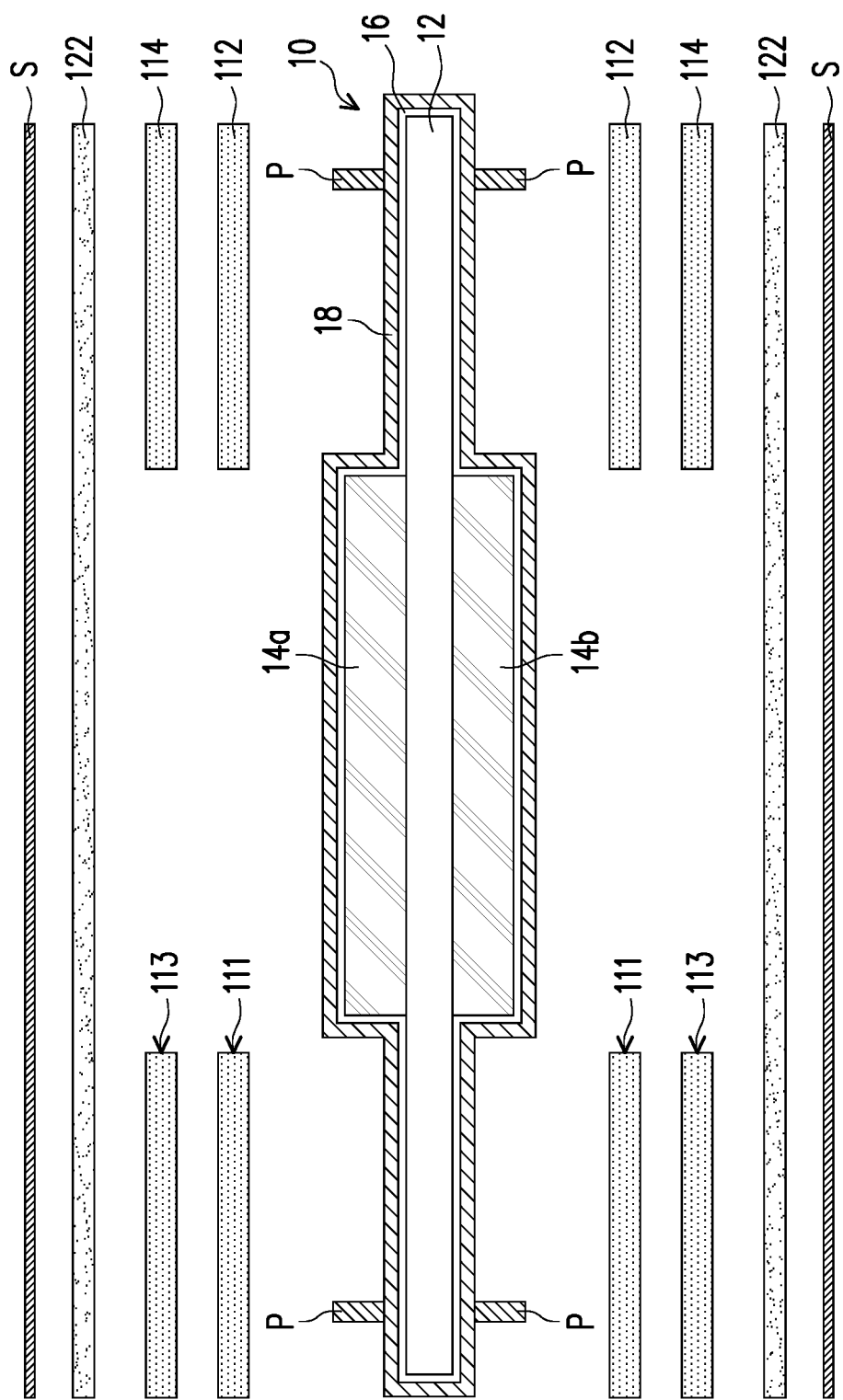
Figure 1C:
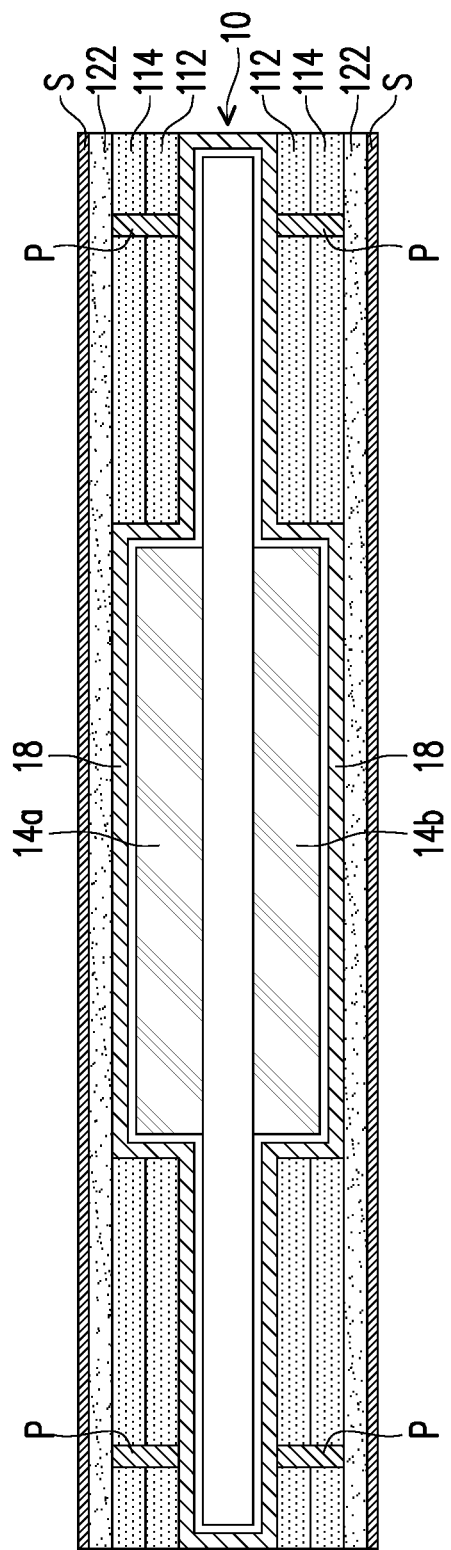

Then, with reference to FIG. 1B and FIG. 1C together, by hot press, first insulating layers 112 and 114, a second insulating layer 122 located on the first insulating layer 114, and a copper sheet S located on the second insulating layer 122 are pressed on the opposite sides of the carrier 10. The first insulating layers 112 and 114 respectively have openings 111 and 113. The openings 111 and 113 are the same in sizes and locations. The openings expose the bumps 14a and 14b, and part of the copper layer 18 located on the bumps 14a and 14b directly contacts the second insulating layer 122. The openings 111 and 113 are formed, for example, by laser ablation on the first insulating layers 112 and 114. At this time, the conductive pillars P penetrate the first insulating layers 112 and 114, and abut the second insulating layer 122. In particular, the first insulating layers 112 and 114 include a material with a low thermal expansion coefficient, for example, between 2 ppm/° C. and 5 ppm/° C., and a thermal expansion coefficient of the second insulating layer 122 is equal to or greater than a thermal expansion coefficient of the first insulating layers 112 and 114. Herein, the material of the first insulating layers 112 and 114 is, for example, glass fiber resin, and a material of the second insulating layer 122 and a second insulating layer 124 is bismaleimide-triazine resin (BT resin) or an Ajinomoto build-up film (ABF).

Figure 1D:
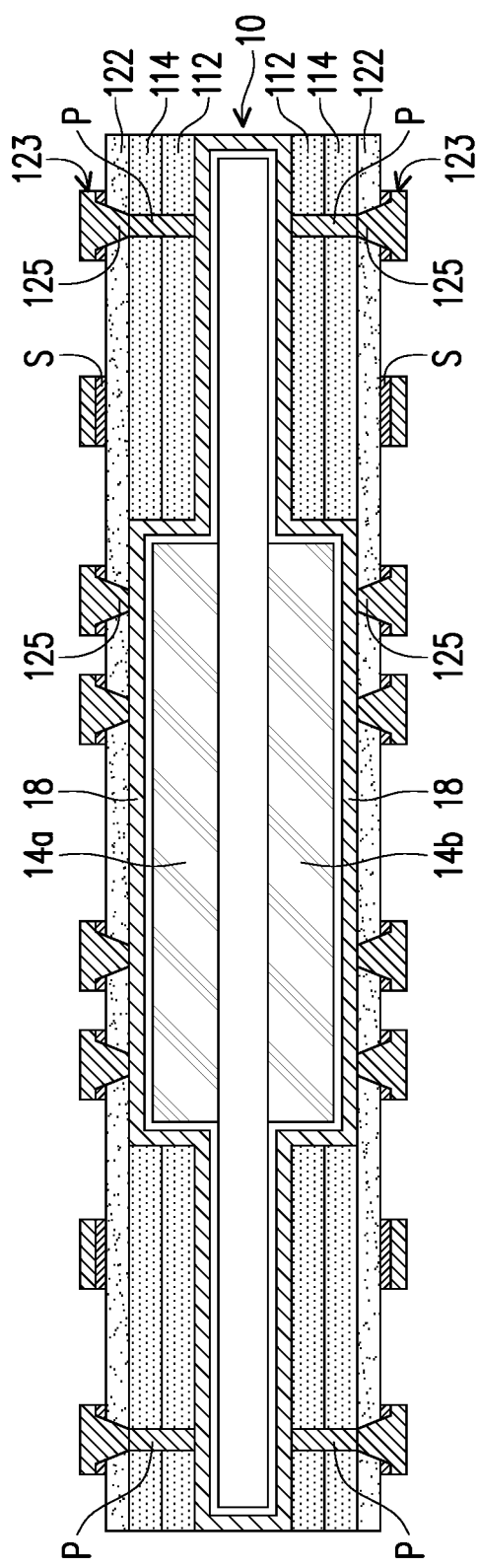
Figure 1E:
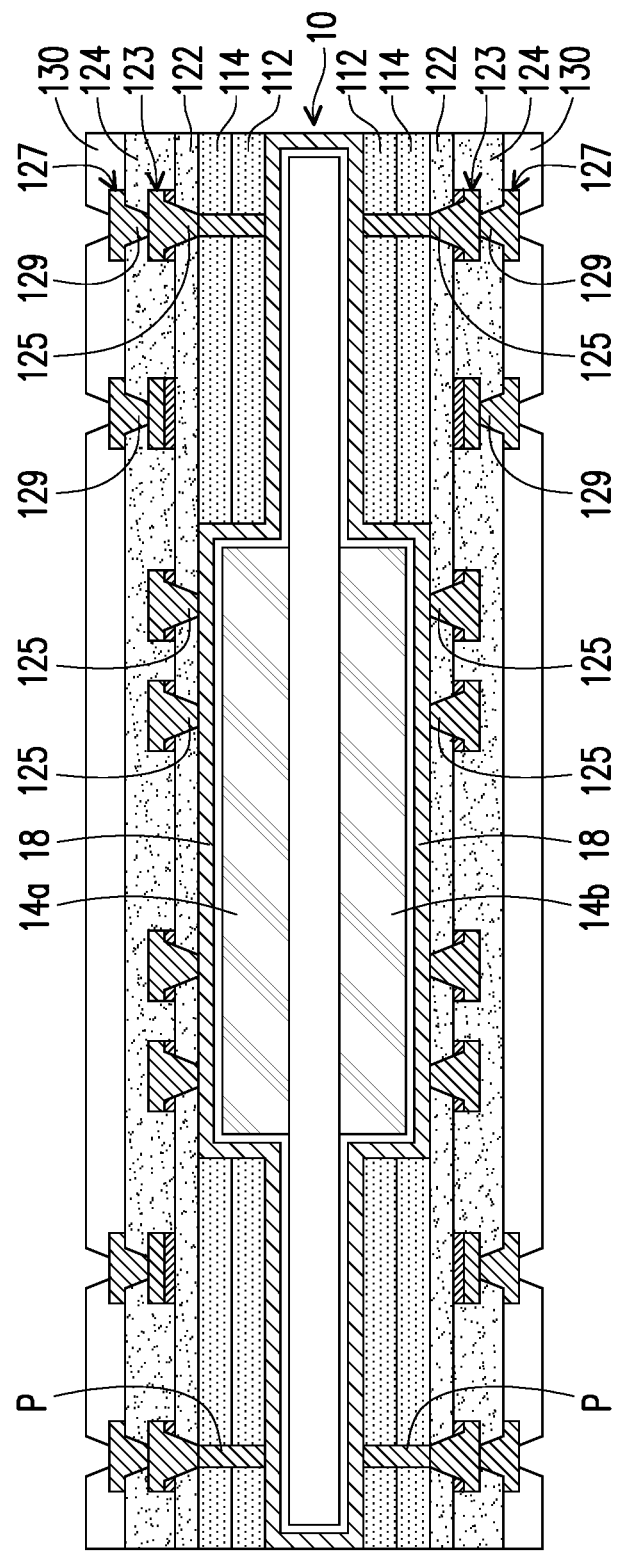

Then, with reference to FIG. 1D and FIG. 1E together, drilling process, electroplating process, patterning process, and layer build-up process are performed on the copper sheet S and the second insulating layer 122 to form a plurality of conductive through holes 125 and 129, a plurality of patterned circuit layers 123 and 127, and the second insulating layer 124. The conductive through holes 125 and 129 are embedded in the second insulating layers 122 and 124, and the patterned circuit layers 123 and 127 are alternately stacked with the second insulating layers 122 and 124. The patterned circuit layers 123 and 127 are electrically connected through the conductive through holes 125 and 129, and the patterned circuit layers 123 and 127 are electrically connected to the conductive pillars P through the conductive through holes 125 and 129.

Then, with reference to FIG. 1E, a solder mask layer 130 is formed on the outermost second insulating layer 124. The solder mask layer 130 exposes part of the outermost patterned circuit layer 127, which is configured to serve as an electrically connecting point with an external circuit.

Figure 1F:
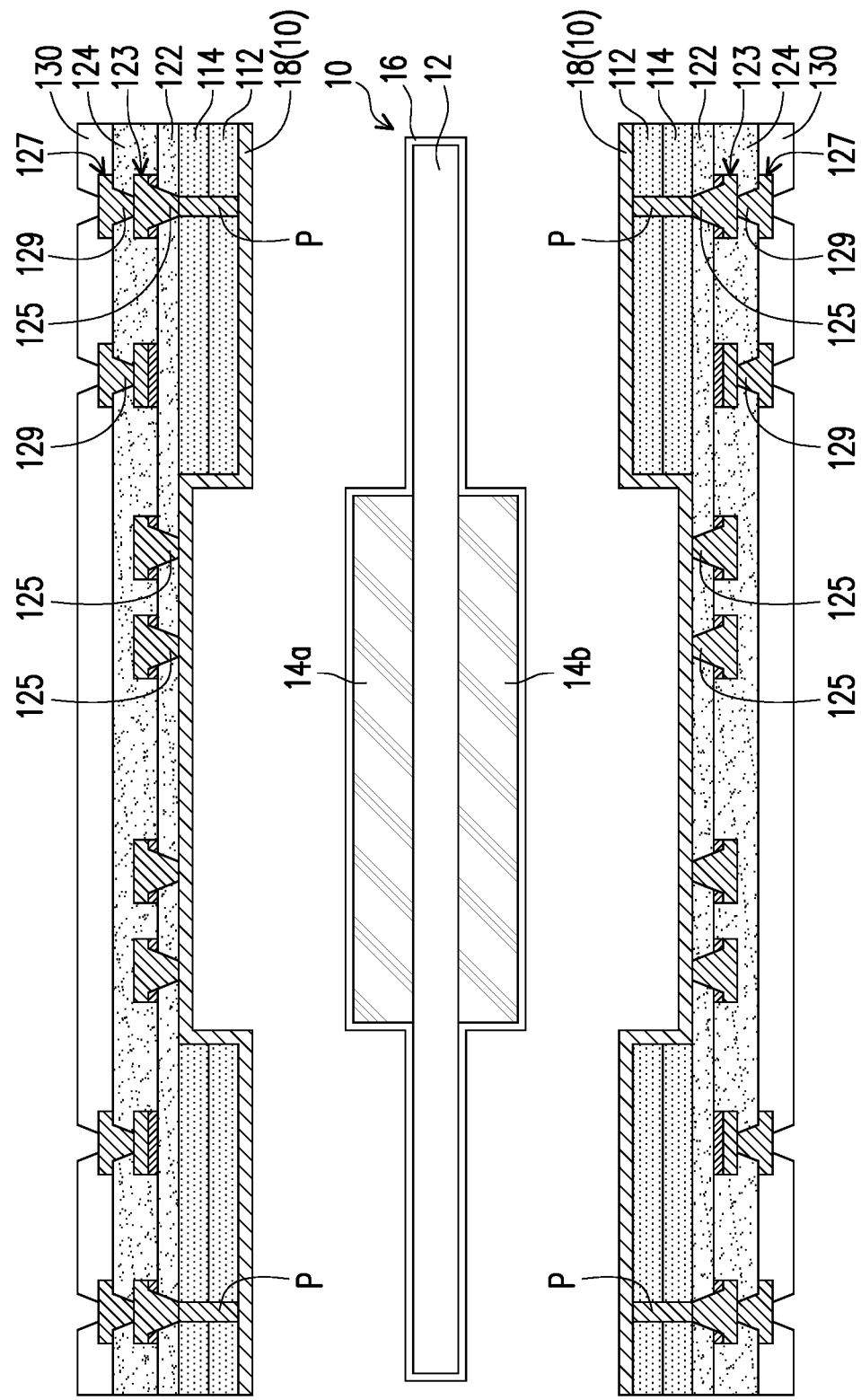
Figure 1G:
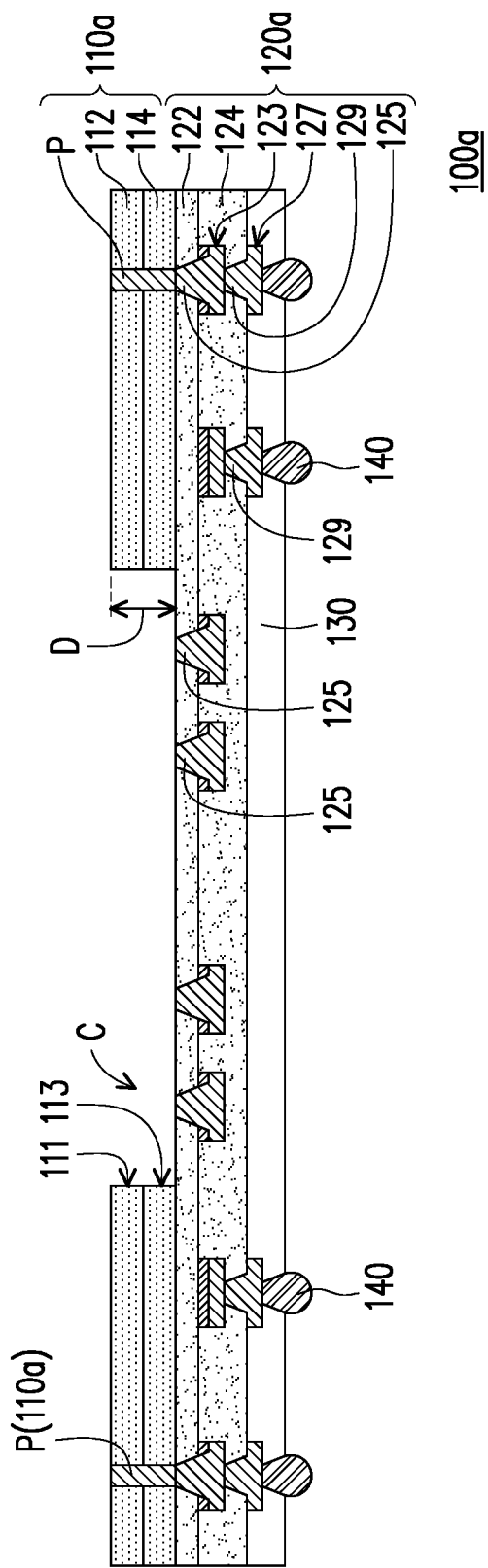

After that, with reference to FIG. 1F and FIG. 1G together, the carrier 10 and the first insulating layers 112 and 114 are separated to form two separate chip carriers 100a. The step of separating the carrier 10 and the first insulating layers 112 and 114 includes the following. First, the copper layer 18 and the stainless steel layer 16 are separated. After that, the copper layer 18 is removed to expose the first insulating layer 112. Herein, each chip carrier 100a includes a first structure layer 110a and a second structure layer 120a that are stacked with each other. The first structure layer 110a includes the first insulating layers 112 and 114 and the conductive pillars P. The second structure layer 120a includes the second insulating layers 122 and 124, the conductive through holes 125 and 129, and the patterned circuit layers 123 and 127. In addition, the first structure layer 110a and the second structure layer 120a define the cavity C. Herein, the depth D of the cavity C is, for example, between 150 μm and 300 μm.

Finally, with reference to FIG. 1G, solder balls 140 are formed on the patterned circuit layer 127 exposed by the solder mask layer 130. So far, the manufacturing of the chip carrier 100a has been completed.

Structurally, with further reference to FIG. 1G, the chip carrier 100a includes the first structure layer 110a and the second structure layer 120a. The first structure layer 110a has the openings 111 and 113 and includes the first insulating layers 112 and 114. The thermal expansion coefficient of the first insulating layers 112 and 114 is between 2 ppm/° C. and 5 ppm/° C. The second structure layer 120a is disposed on the first structure layer 110a, and defines the cavity C with the first structure layer 110a. The second structure layer 120a includes the second insulating layers 122 and 124, and the thermal expansion coefficient of the second insulating layers 122 and 124 is equal to or greater than the thermal expansion coefficient of the first insulating layers 112 and 114. The material of the first insulating layers 112 and 114 is, for example, glass fiber resin, and the material of the second insulating layers 122 and 124 is, for example, bismaleimide-triazine resin (abbreviated as BT resin) or an Ajinomoto build-up film (ABF).

Furthermore, in this embodiment, the first structure layer 110a also includes the conductive pillars P, and the conductive pillars P penetrate the first insulating layers 112 and 114 overlapping each other. In other words, the first structure layer 110a may be regarded as a padding material with no wires disposed thereon. The second structure layer 120a also includes the conductive through holes 125 and 129 and the patterned circuit layers 123 and 127. The conductive through holes 125 and 129 are embedded in the second insulating layers 122 and 124, and the patterned circuit layers 123 and 127 are alternately stacked with the second insulating layers 122 and 124. The patterned circuit layers 123 and 127 are electrically connected through the conductive through holes 125 and 129, and the patterned circuit layers 123 and 127 are electrically connected to the conductive pillars P of the first structure layer 110a through the conductive through holes 125 and 129. In this embodiment, since the core substrate is absent, it is not necessary to consider the mechanical balance between the upper and lower sides. Therefore, each build-up layer is due to functional needs, thus reducing the total number of build-up layers, up to one-half at most.

Furthermore, the chip carrier 100a of this embodiment also includes the solder mask layer 130, which is disposed on the second structure layer 120a and exposes part of the patterned circuit layer 127 of the second structure layer 120a. In addition, the chip carrier 100a of this embodiment also includes a plurality of solder balls 140. The solder balls 140 are disposed on the patterned circuit layer 127 exposed by the solder mask layer 130.

Briefly speaking, in the design of the chip carrier 100a of this embodiment, the second structure layer 120a and the first structure layer 110a having the openings 111 and 113 define a position (i.e., the cavity C) for placing, for example, a chip and/or a position for placing an embedded chip. Herein, the low thermal expansion coefficient of the first insulating layers 112 and 114 in the first structure layer 110a is only between 2 ppm/° C. and 5 ppm/° C. In this way, the chip disposed in the cavity C and located in the openings 111 and 113 can have a thermal expansion coefficient close to that of the first insulating layers 112 and 114, facilitating reliability in subsequent packaging. Moreover, since the carrier 10 of the embodiment is a reusable carrier, and thus may be reused after board separation, reducing the manufacturing cost. Furthermore, two chip carriers 100a may be formed at the same time after board separation, thus reducing the production costs.

Figure 2:
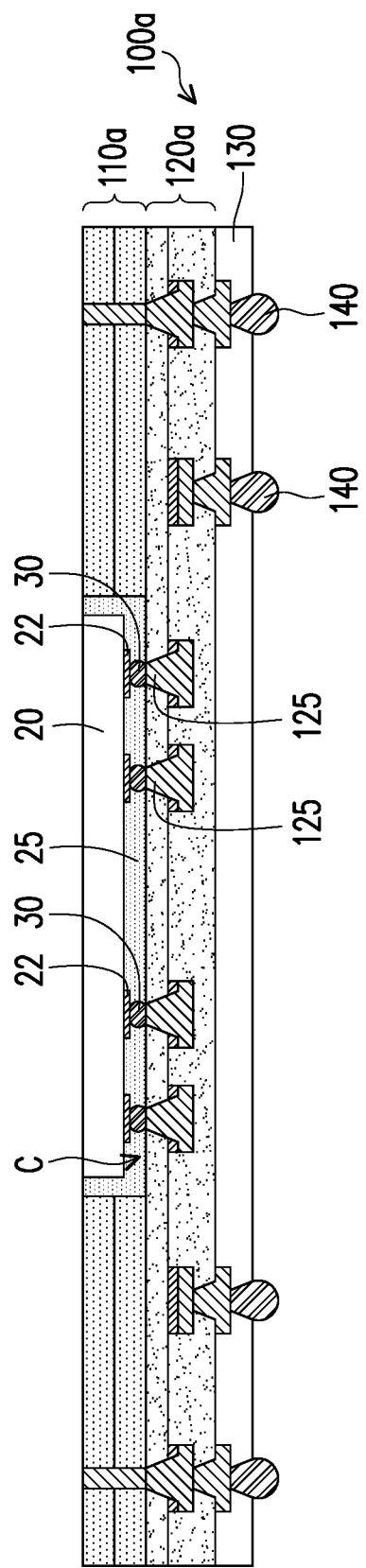
FIG. 2 is a schematic cross-sectional view of the chip carrier of FIG. 1G provided with a chip after the manufacturing of the carrier is completed.

In terms of application, reference may be made to FIG. 2, which is a schematic cross-sectional view of the chip carrier of FIG. 1G provided with a chip after the manufacturing of the carrier is completed. A chip 20 may be disposed in the cavity C of the chip carrier 100a in FIG. 1G, and pads 22 of the chip 20 are electrically connected to the conductive through holes 125 of the second structure layer 120a through solder balls 30. In other words, the chip 20 is disposed on the chip carrier 100a through flip-chip bonding. An underfill 25 is filled into the cavity C to cover the pads 22 of the chip 20 and the solder balls 30.

In this embodiment, the use of resin molding is not required in the packaging of the chip 20, thus reducing the costs, the interaction complexity between materials, and the overall product thickness. Moreover, since the chip 20 is disposed in the cavity C of the chip carrier 100a, it is protected, and can pass a reliability drop test. Furthermore, the back surface of the chip 20 inside the cavity C is exposed and is not covered by the packaging material, thus having better heat dissipation.

Herein, it should be noted that the reference numerals and part of the content of the above embodiments remain to be used in the following embodiments, where the same reference numerals are adopted to represent the same or similar elements, and the description of the same technical content is omitted. Reference may be made to the above embodiments for the description of the omitted part, which will not be repeated in the following embodiments.

Figure 3A:
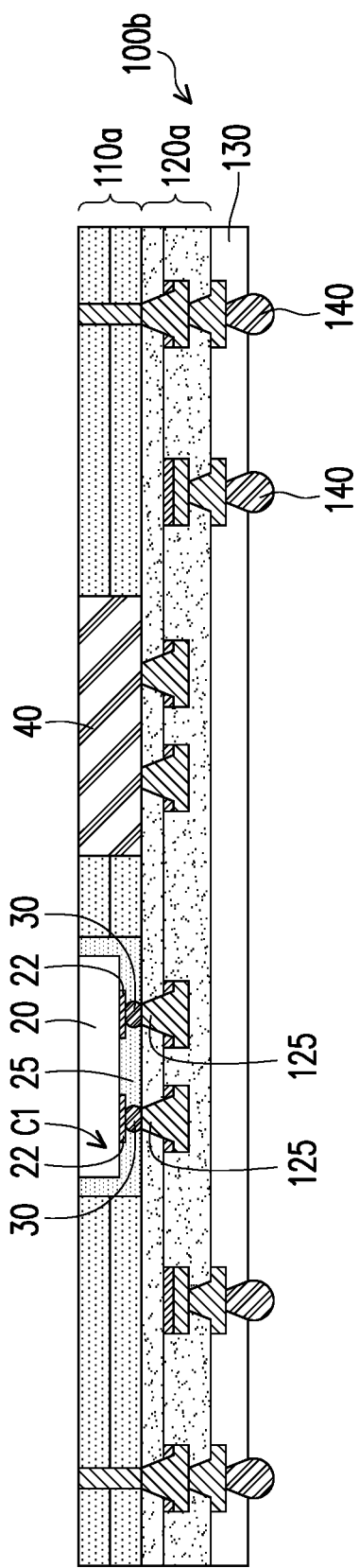
FIG. 3A is a cross-sectional schematic diagram of a chip carrier and a chip and an embedded chip disposed on the chip carrier according to another embodiment of the disclosure.

FIG. 3A is a cross-sectional schematic diagram of a chip carrier and a chip and an embedded chip disposed on the chip carrier according to another embodiment of the disclosure. With reference to FIG. 1B and FIG. 3A together, in a chip carrier 100b of this embodiment, after the stainless steel layer 16 is sputtered on the bumps 14a and 14b and the copper layer 18 is formed, an embedded chip 40 is placed beside the bumps 14a and 14b. Then, the first insulating layers 112 and 114 are pressed. The first insulating layers 112 and 114 have openings in positions corresponding to the bumps 14a and 14b and the embedded chip 40. In this embodiment, the chip 20 is disposed in a cavity C1 of the chip carrier 100b, and the pads 22 of the chip 20 are electrically connected to the chip carrier 100b through the solder balls 30. The embedded chip 40 is disposed on a side of the cavity C1 of the chip carrier 100b, and directly contacts the second circuit layer 120a by drilling and copper plating.

Figure 3B:
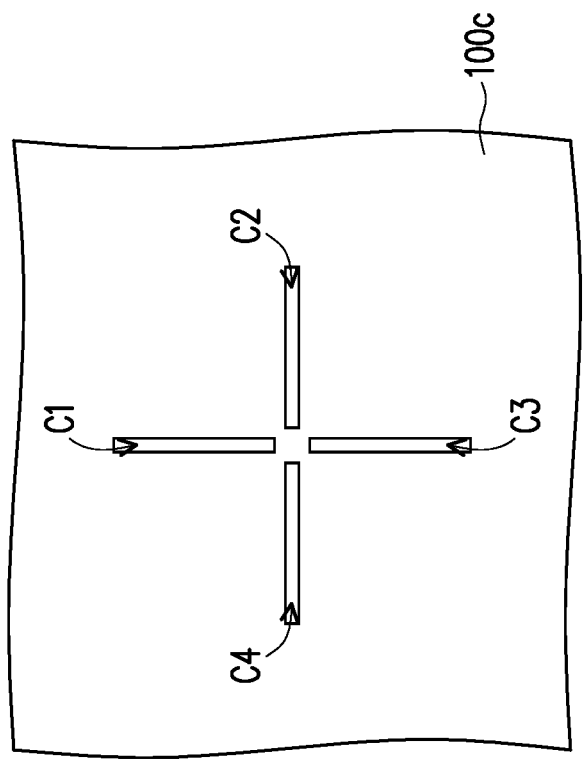
FIG. 3B is a partial top view of a chip carrier according to another embodiment of the disclosure.

FIG. 3B is a partial top view of a chip carrier according to another embodiment of the disclosure. With reference to FIG. 2 and FIG. 3B together, a chip carrier 100c of this embodiment is similar to the chip carrier 100a, and is different in that, in this embodiment, the chip carrier 100c has four cavities C1, C2, C3, and C4. In bottoms of each of the cavities C1, C2, C3, and C4, there does not exist a rounded corner or chamfered corner design.

Notably, the disclosure does not limit the number of cavities of the chip carrier and the members disposed therein. It is possible to provide only one cavity or a plurality of cavities. The members disposed in the cavity may include only chips, only passive elements, or a combination of chips and passive elements. All the above-mentioned fall within the intended protection scope of the disclosure.

Figure 4:
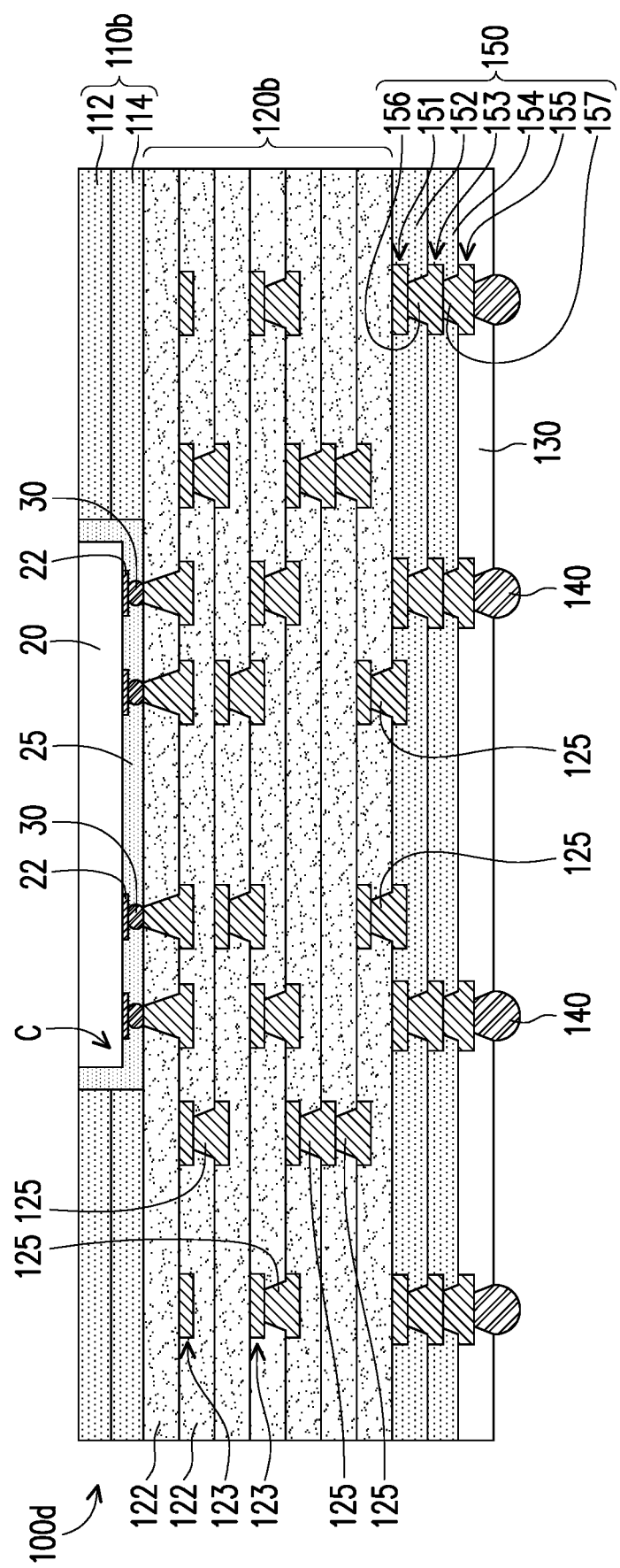
FIG. 4 is a cross-sectional schematic diagram of a chip carrier and a chip disposed on the chip carrier according to another embodiment of the disclosure.

FIG. 4 is a cross-sectional schematic diagram of a chip carrier and a chip disposed on the chip carrier according to another embodiment of the disclosure. With reference to FIG. 2 and FIG. 4 together, a chip carrier 100d of this embodiment is similar to the chip carrier 100a, and is different in the following. A first structure layer 110b of the chip carrier 100d of this embodiment is not provided with conductive pillars, and the first insulating layers 112 and 114 of the first structure layer 110b are directly stacked with each other. The second insulating layer 122 of a second structure layer 120b include seven second structure layers 120b, and the patterned circuit layer 123 include six patterned circuit layers 123. The conductive through holes 125 are embedded in the second insulating layers 122. The patterned circuit layers 123 are alternately stacked with the second insulating layers 122. Besides, the patterned circuit layers 123 are electrically connected through the conductive through holes 125.

In addition, the chip carrier 100d of this embodiment also includes a third structure layer 150, which is disposed on the second structure layer 120b and is electrically connected to the second structure layer 120b. The second structure layer 120b is located between the first structure layer 110b and the third structure layer 150. The third structure layer 150 includes third insulating layers 152 and 154, and a thermal expansion coefficient of the third insulating layers 152 and 154 is the same as the thermal expansion coefficient of each of the first insulating layers 112 and 114. Moreover, the third structure layer 150 of the embodiment also includes conductive through holes 156 and 157 and patterned circuit layers 151, 153 and 155. The conductive through holes 156 and 157 are embedded in the third insulating layers 152 and 154. The patterned circuit layers 151, 153, and 155 are alternately stacked with the third insulating layers 152 and 154. The patterned circuit layers 151, 153, and 155 are electrically connected through the conductive through holes 156 and 157. Furthermore, the patterned circuit layers 151, 153, and 155 are electrically connected to the conductive through holes 125 of the second structure layer 120b through the conductive through holes 156 and 157.

Figure 5:
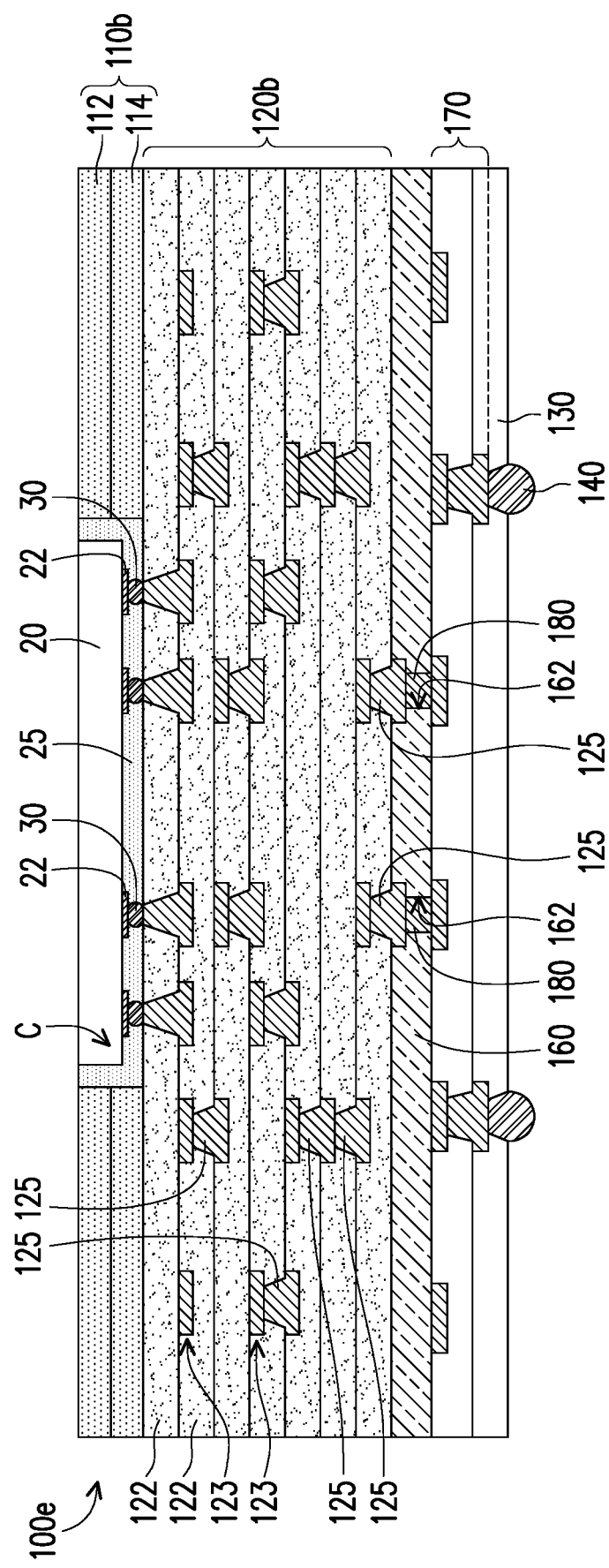
FIG. 5 is a cross-sectional schematic diagram of a chip carrier and a chip disposed on the chip carrier according to another embodiment of the disclosure.

FIG. 5 is a cross-sectional schematic diagram of a chip carrier and a chip disposed on the chip carrier according to another embodiment of the disclosure. With reference to FIG. 4 and FIG. 5 together, a chip carrier 100e of this embodiment is similar to the chip carrier 100d, and is different in the following. In this embodiment, the third structure layer 170 may include one structure layer or multiple structure layers that have been separately manufactured. Moreover, the chip carrier 100e of this embodiment also includes an adhesive sheet 160, which is disposed on the second structure layer 120b, and is in a B stage. The third structure layer 170 is disposed on the adhesive sheet 160, and the third structure layer 170 is fixed on the second structure layer 120b through the adhesive sheet 160. Herein, the third structure layer 170 is positioned on the second structure layer 120b through the adhesive sheet 160 by alignment and pressing. In addition, the chip carrier 100e of this embodiment also includes a conductive paste 180. The adhesive sheet 160 has a plurality of through holes 162, and the conductive paste 180 is filled in the through holes 162, and electrically connects the third structure layer 170 with the second structure layer 120b. In other words, when the third structure layer 170 is aligned and pressed onto the adhesive sheet 160, the conductive paste 180 directly electrically connects the third structure layer 170 with the second structure layer 120b.

In summary of the foregoing, in the design of the chip carrier of the disclosure, the second structure layer and the first structure layer having the opening define the cavity for placing, for example, the chip and/or the passive element. The low thermal expansion coefficient of the first insulating layer in the first structure layer is only between 2 ppm/° C. and 5 ppm/° C. In this way, the chip disposed in the cavity and located in the opening have a thermal expansion coefficient similar to that of the first insulating layer, facilitating reliability in subsequent packaging.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A chip carrier, comprising:
   a first structure layer having at least one opening and comprising at least one first electrically insulating layer, wherein a thermal expansion coefficient of the at least one first electrically insulating layer is between 2 ppm/° C. and 5 ppm/° C.; and
   a second structure layer disposed on the first structure layer, defining at least one cavity in a finished circuit carrier with the first structure layer, and comprising at least one second electrically insulating layer, wherein a thermal expansion coefficient of the at least one second electrically insulating layer is greater than the thermal expansion coefficient of the at least one first electrically insulating layer.

2. The chip carrier according to claim 1, wherein a material of the at least one first electrically insulating layer comprises glass fiber resin.

3. The chip carrier according to claim 1, wherein a material of the at least one second electrically insulating layer comprises bismaleimide-triazine resin or an Ajinomoto build-up film.

4. The chip carrier according to claim 1, wherein the second structure layer further comprises a plurality of conductive through holes and a plurality of patterned circuit layers, the at least one second electrically insulating layer comprises a plurality of second electrically insulating layers, the conductive through holes are embedded in the second electrically insulating layers, the patterned circuit layers are alternately stacked with the second electrically insulating layers, and the patterned circuit layers are electrically connected through the conductive through holes.

5. The chip carrier according to claim 4, wherein the first structure layer also comprises a plurality of conductive pillars, the at least one first electrically insulating layer comprises a plurality of first electrically insulating layers, the conductive pillars penetrate the first electrically insulating layers overlapping each other, the patterned circuit layers of the second structure layer are electrically connected to the conductive pillars of the first structure layer through the conductive through holes.

6. The chip carrier according to claim 4, wherein the at least one first electrically insulating layer of the first structure layer comprises a plurality of first electrically insulating layers, and the first electrically insulating layers are directly stacked together with each other.

7. The chip carrier according to claim 6, further comprising:
   a third structure layer disposed on the second structure layer and being electrically connected to the second structure layer, wherein the second structure layer is located between the first structure layer and the third structure layer, the third structure layer comprises at least one third electrically insulating layer, and a thermal expansion coefficient of the at least one third electrically insulating layer is the same as the thermal expansion coefficient of each of the first electrically insulating layers.

8. The chip carrier according to claim 6, further comprising:
   an adhesive sheet disposed on the second structure layer, wherein the adhesive sheet is in a B stage; and
   at least one third structure layer disposed on the adhesive sheet, wherein the at least one third structure layer is fixed on the second structure layer through the adhesive sheet.

9. The chip carrier according to claim 8, further comprising:
   a conductive paste, wherein the adhesive sheet has a plurality of through holes, and the conductive paste is filled in the through holes, and electrically connects the at least one third structure layer to the second structure layer.

10. The chip carrier according to claim 1, further comprising:
    a solder mask layer disposed on the second structure layer, and exposing part of the second structure layer.

11. The chip carrier according to claim 10, further comprising:
    a plurality of solder balls disposed on the second structure layer exposed by the solder mask layer.

12. The chip carrier according to claim 1, wherein a depth of the at least one cavity in the finished circuit carrier is between 150 μm and 300 μm.

13. A manufacturing method of a chip carrier, comprising:
    providing a reusable carrier, wherein the carrier comprises a core layer, a plurality of bumps disposed on opposite sides of the core layer, a stainless steel layer sputtered on the core layer and the bumps, and a copper layer formed on the stainless steel layer;

pressing at least one first electrically insulating layer and at least one second electrically insulating layer located on the at least one first electrically insulating layer on opposite sides of the carrier, wherein the at least one first electrically insulating layer has at least one opening, the at least one opening exposes the bumps, and part of the copper layer located on the bumps directly contacts the at least one second electrically insulating layer, wherein a thermal expansion coefficient of the at least one first electrically insulating layer is between 2 ppm/° C. and 5 ppm/° C., and a thermal expansion coefficient of the at least one second electrically insulating layer is greater than the thermal expansion coefficient of the at least one first electrically insulating layer; and separating the carrier and the at least one first electrically insulating layer to form a plurality of chip carriers separated from each other, wherein each of the chip carriers comprises a first structure layer and a second structure layer stacked with each other, the first structure layer comprises the at least one first electrically insulating layer, the second structure layer comprises the at least one second electrically insulating layer, and the first structure layer and the second structure layer define at least one cavity in a finished circuit carrier.

14. The manufacturing method according to claim 13, further comprising:

while pressing the at least one first electrically insulating layer and the at least one second electrically insulating layer located on the at least one first electrically insulating layer on the opposite sides of the carrier, pressing a copper sheet on the at least one second electrically insulating layer; and performing a drilling process, an electroplating process, a patterning process, and a layer build-up process on the copper sheet and the at least one second electrically insulating layer to form a plurality of conductive through holes and a plurality of patterned circuit layers, wherein the at least one second electrically insulating layer comprises a plurality of second electrically insulating layers, the conductive through holes are embedded in the second electrically insulating layers, the patterned circuit layers are alternately stacked with the second electrically insulating layers, and the patterned circuit layers are electrically connected through the conductive through holes.

15. The manufacturing method according to claim 14, further comprising:

before pressing the at least one first electrically insulating layer and the at least one second electrically insulating layer located on the at least one first electrically insulating layer on the opposite sides of the carrier, forming a plurality of conductive pillars on the opposite sides of the carrier, wherein the conductive pillars are located on the copper layer;

after pressing the at least one first electrically insulating layer and the at least one second electrically insulating layer located on the at least one first electrically insulating layer on the opposite sides of the carrier, causing the conductive pillars to penetrate the at least one first electrically insulating layer and abut the at least one second electrically insulating layer; and after forming the conductive through holes and the patterned circuit layers, electrically connecting the patterned circuit layers with the conductive pillars through the conductive through holes.

16. The manufacturing method according to claim 14, further comprising:

before separating the carrier and the at least one first electrically insulating layer, forming a solder mask layer on the outermost one of the at least one second electrically insulating layer, wherein the solder mask layer exposes part of the outermost one of the patterned circuit layers.

17. The manufacturing method according to claim 16, further comprising:

after separating the carrier and the at least one first electrically insulating layer, forming a plurality of solder balls on the patterned circuit layer exposed by the solder mask layer.

18. The manufacturing method according to claim 13, wherein the step of separating the carrier and the at least one first electrically insulating layer comprises:

separating the copper layer and the stainless steel layer; and removing the copper layer and exposing the at least one first electrically insulating layer.

19. The manufacturing method according to claim 13, wherein a material of the at least one first electrically insulating layer comprises glass fiber resin.

20. The manufacturing method according to claim 13, wherein a material of the at least one second electrically insulating layer comprises bismaleimide-triazine resin or an Ajinomoto build-up film.

21. The manufacturing method according to claim 13, wherein a depth of the at least one cavity in the finished circuit carrier is between 150 µm and 300 µm.

22. The manufacturing method according to claim 13, wherein after sputtering the stainless steel layer on the bumps and forming the copper layer on the stainless steel layer, placing a chip beside the bumps, and in the step of pressing the at least one first electrically insulating layer and the at least one second electrically insulating layer located on the at least one first electrically insulating layer, first pressing the at least one first electrically insulating layer, such that the at least one opening of the at least one first electrically insulating layer exposes the bumps and the chip, and then pressing the at least one second electrically insulating layer.

23. The manufacturing method according to claim 13, wherein the reusable carrier comprises a sheet-shaped or roll-shaped core substrate, a sheet-shaped or roll-shaped stainless steel board, a sheet-shaped or roll-shaped glass substrate with thin layers of titanium and copper, or a flexible copper clad laminate.

* * * * *